(12) United States Patent
Li et al.

(10) Patent No.: US 7,410,844 B2
(45) Date of Patent: Aug. 12, 2008

(54) DEVICE FABRICATION BY ANISOTROPIC WET ETCH

(75) Inventors: Yujun Li, Portland, OR (US); Kenneth T. Settlemyer, Jr., Bradenton, FL (US); Jochen Beintner, Reutlingen (DE)

(73) Assignee: International Business Machines Corporation, Armonk, NY (US)

( * ) Notice: Subject to any disclaimer, the term of this patent is extended or adjusted under 35 U.S.C. 154(b) by 450 days.

(21) Appl. No.: 11/333,108

(22) Filed: Jan. 17, 2006

(65) Prior Publication Data
US 2007/0166900 A1   Jul. 19, 2007

(51) Int. Cl.
*H01L 21/336* (2006.01)

(52) U.S. Cl. .................. 438/156; 438/268; 438/753; 257/329; 257/E21.41

(58) Field of Classification Search ............... 438/156, 438/268, 753; 257/329, E21.41
See application file for complete search history.

(56) References Cited

U.S. PATENT DOCUMENTS

| | | | |
|---|---|---|---|
| 5,849,624 A | 12/1998 | Fazan | 438/398 |
| 6,475,890 B1 * | 11/2002 | Yu | 438/574 |
| 6,566,273 B2 | 5/2003 | Kudelka | 438/733 |
| 6,642,090 B1 * | 11/2003 | Fried et al. | 438/164 |
| 6,734,077 B2 | 5/2004 | Forster | 438/386 |
| 2006/0086977 A1 * | 4/2006 | Shah et al. | 257/347 |
| 2007/0001173 A1 * | 1/2007 | Brask et al. | 257/67 |
| 2007/0167024 A1 | 7/2007 | Li | 438/197 |

\* cited by examiner

*Primary Examiner*—Bradley W. Baumeister
*Assistant Examiner*—Steven J Fulk
(74) *Attorney, Agent, or Firm*—George Sai-Halasz; Robert M. Trepp

(57) ABSTRACT

A method of fabrication and a field effect device structure are presented that reduce source/drain capacitance and allow for device body contact. A Si based material pedestal is produced, the top surface and the sidewalls of which are oriented in a way to be substantially parallel with selected crystallographic planes of the pedestal and of a supporting member. The pedestal is wet etched with an anisotropic solution containing ammonium hydroxide. The sidewalls of the pedestal become faceted forming a segment in the pedestal with a reduced cross section. The dopant concentration in the reduced cross section segment is chosen to be sufficiently high for it to provide for electrical continuity through the pedestal.

1 Claim, 4 Drawing Sheets

US 7,410,844 B2

DEVICE FABRICATION BY ANISOTROPIC WET ETCH

FIELD OF THE INVENTION

The present invention relates to devices used in integrated circuits and their manufacturing. More particularly, the present invention relates to a field effect device fabrication process which improves device performance, and relates to the resulting device structure.

BACKGROUND OF THE INVENTION

Today's integrated circuits include a vast number of devices. Smaller devices and shrinking ground rules are the key to enhance performance and to improve reliability. As FET (Field Effect Transistor) devices are being scaled down, the technology becomes more complex, and changes in device structures and new fabrication methods are needed to maintain the expected performance enhancement from one generation of devices to the next. The mainstay material of microelectronics is silicon (Si), or more broadly, Si based materials. One such Si based material of importance for microelectronics is the silicon-germanium (SiGe) alloy.

There is great difficulty in maintaining performance improvements in devices of deeply submicron generations. Various detrimental device effects become more serious with successively decreasing device dimensions. For instance, with shortening gate lengths the so called short channel effects, most notably the "drain induced barrier lowering" pose severe roadblocks to miniaturization. Also, parasitic capacitances, such as source and drain capacitance, stand in the way of device performance. Several avenues are being explored in the art for keeping device performance improvements on track. One approach to deal with unwanted device capacitance is to utilize so called semiconductor on insulator (SOI), usually Si on insulator, technology. SOI devices typically are fabricated in a thin semiconductor layer disposed over an insulator layer. Most commonly, the insulator layer is a so called buried oxide layer on a Si substrate.

In general, FET devices built in SOI technology have the advantage of a lowered source/drain capacitance in comparison to devices built on bulk substrates. When SOI field effect device dimensions are being reduced, typically the SOI Si layer thickness is also reduced in order to have better short channel control of the threshold voltage ($V_t$). Eventually, the reduction of the SOI Si layer thickness results in FETs with floating body. A floating device body means that the device body potential is not tied to an applied voltage through a body contact. In such a case the threshold voltage, $V_t$, control of the device is more difficult. Field effect devices built on a bulk Si substrate can have body contact, but suffer from higher source/drain capacitance. It would be desirable to have a device which combines lowered source/drain capacitance, with the capacity for body contact.

SUMMARY OF THE INVENTION

In view of the discussed problems, this invention discloses a method of fabrication and a field effect device structure that reduces source/drain capacitance and also allows for device body contact. The method includes the production of a Si based material pedestal, typically by forming a trench in a monocrystalline Si based material member. The top surface and the sidewalls of this pedestal are oriented in a way to be substantially parallel with selected crystallographic planes of the Si based material member. The method further includes the wet etching of the Si based material pedestal with a solution containing ammonium hydroxide ($NH_4OH$). Due to the differing etch rates of the Si based material crystallographic planes in the $NH_4OH$ solution, the sidewalls become faceted thereby undercutting a first segment of the Si based material pedestal and creating a second segment underneath the first segment. The second segment has a smaller cross section than the first segment. In the second segment the dopant concentration is sufficiently high for electrical conductivity, thereby allowing a body contact between the Si based material member and the field effect device hosted by the first segment of the Si based material pedestal. The field effect device has its source/drain capacitance lowered because the undercutting of the first segment makes the source/drain of the device similar to those of SOI devices.

BRIEF DESCRIPTION OF THE DRAWINGS

These and other features of the present invention will become apparent from the accompanying detailed description and drawings, wherein.

DETAILED DESCRIPTION OF THE INVENTION

Figure 1:
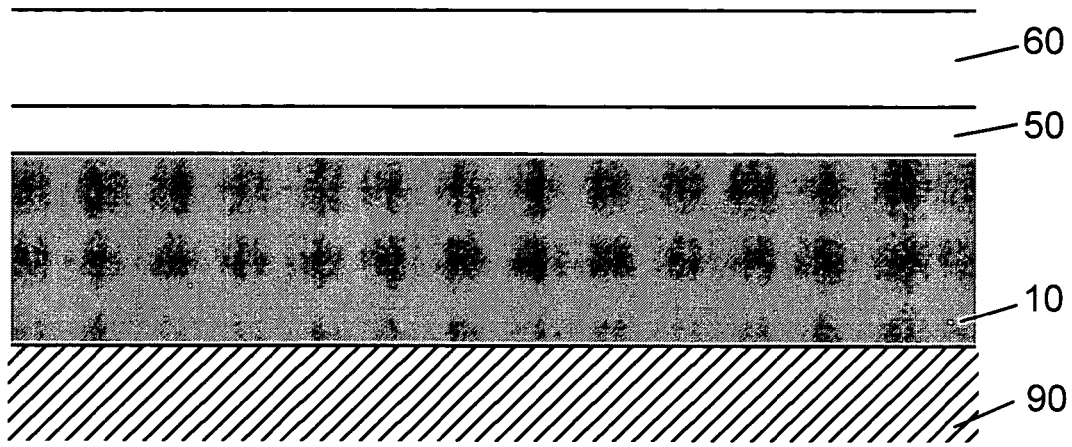
FIG. 1 shows a schematic cross sectional view the initial stage of the fabrication of pedestals in a Si based material member.

FIG. 1 shows a schematic cross sectional view of the initial stage of the fabrication of pedestals involving a semiconductor on insulator (SOI), usually Si on insulator wafer. It is understood that many phases of the description of pedestal fabrication refer to exemplary embodiments, and should not be interpreted in a restrictive manner, as one skilled in the art would recognize alternative paths of fabrication.

Providing a wafer is the starting point of the device fabrication process. The wafer may be a bulk Si wafer, a Si wafer with a Si based material layer on the surface, or a semiconductor on insulator (SOI) wafer. The figures depict a representative embodiment using a SOI wafer with the understanding that the depiction could equally well show a bulk wafer. In FIG. 1 a Si based material member 10, is a layer of an SOI wafer on top of a buried insulating layer 90. In alternative embodiments where the member 10 is a bulk wafer, the insulator 90 would not be present. For SOI wafers the Si based material member 10 would be preferably thick enough to host partially depleted FETs. In all preferred embodiments the Si based material member 10 in the region where pedestals will be located is of monocrystalline material nature, as it is usual in the art of Si based microelectronics. In various embodiments of this disclosure the Si based material may be essentially pure Si, or it may be a SiGe alloy with up to approximately 60% of Ge concentration.

In a representative embodiment of the invention a thin dielectric layer 50, typically between approximately 2 nm and 20 nm thick pad oxide, is formed on the member 10, by thermal oxidation or by chemical vapor deposition (CVD). On top of the oxide 50 another dielectric 60, typically a pad nitride, is deposited using a CVD deposition process. The thickness of the pad nitride 60 in typical embodiments may be in the range of 20 nm to 200 nm. The oxide 50 and nitride 60 layers serve to later define active device areas and isolation areas, and to protect surfaces during subsequent processing. One skilled in the art would recognize the possibility of achieving such aims by other means than oxide and nitride layers.

Figure 2:
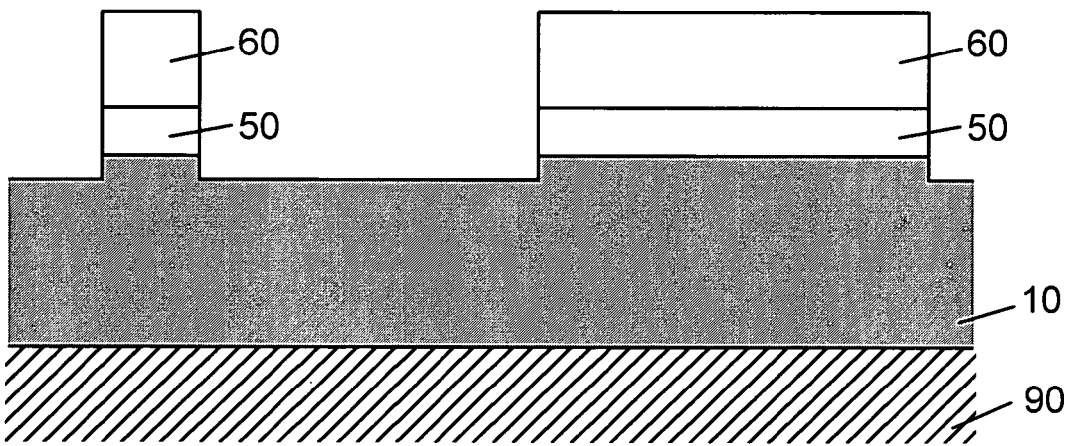
FIG. 2 shows a schematic cross sectional view of the fabrication of pedestals in a Si based material member, where protective layers have been applied and trench locations defined.

FIG. 2 shows a schematic cross sectional view of the fabrication of pedestals in a Si based material member where protective the layers have been applied and trench locations defined. Active FET device areas and the trench isolation areas are separated by lithographic processes, and some Si based material is removed to a depth of between about 20 nm and 60 nm, typically in a reactive ion etch (RIE) process. In alternate embodiments this shallow Si based material removal may be omitted.

Figure 3:
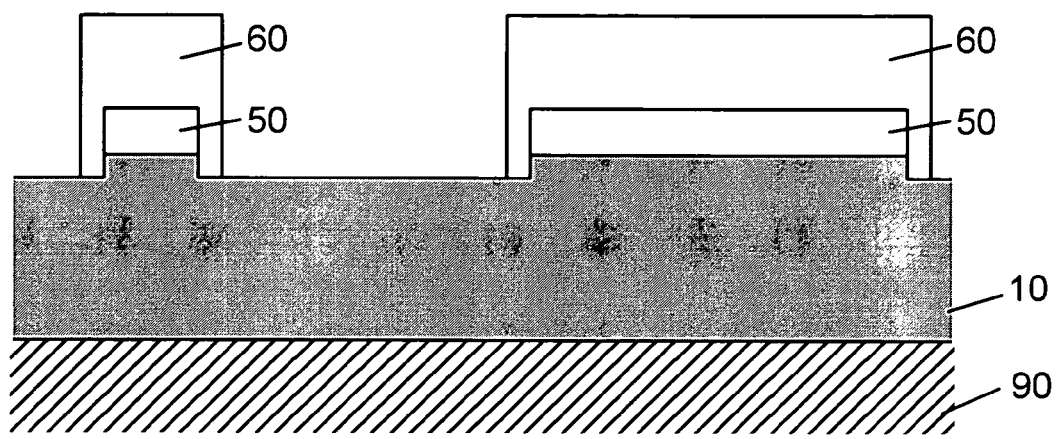
FIG. 3 shows a schematic cross sectional view in the fabrication of pedestals in a Si based material member where the structure is prepared for forming trenches.

FIG. 3 shows a schematic cross sectional view in the fabrication of pedestals in a Si based material member where the structure is prepared for forming trenches. Through processes known in the art the nitride layer 60 is extended to protect the sidewalls exposed in the earlier shallow Si based material removal.

Figure 4:
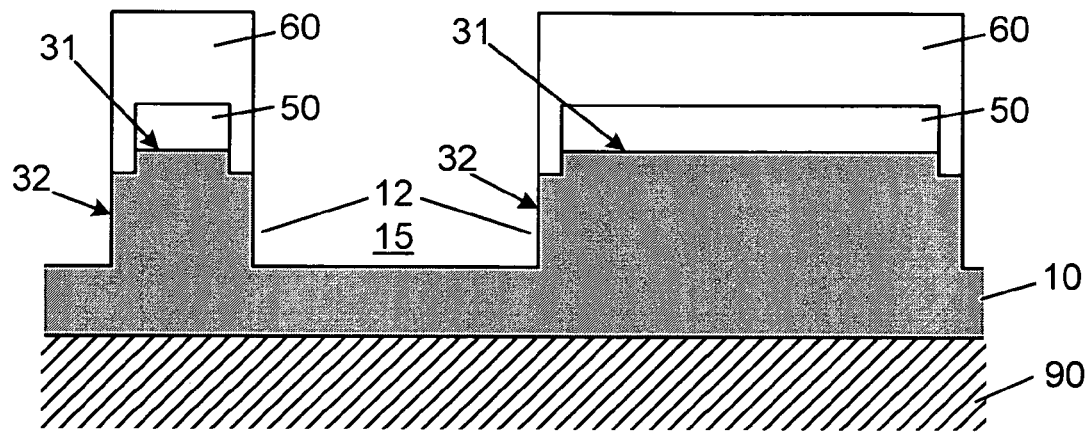
FIG. 4 shows a schematic cross sectional view in the fabrication of pedestals in a Si based material member where trenches have been formed defining pedestals.

FIG. 4 shows a schematic cross sectional view in the fabrication of pedestals in a Si based material member where trenches have been formed defining pedestals. Si based material pedestals 12 have been defined by a trench 15 in the monocrystalline member 10. In a representative embodiment the trench etching is done using RIE. After this RIE process the depth of the trench 15 is selected based on the requirement for isolation of the device areas, as it is known in the art, less the amount of Si based material that will be removed in a follow up wet etching process. Sidewalls 32 have been exposed on the pedestals 12. The top surface of the pedestal 31 and the plurality of sidewalls 32 are so oriented as to be substantially parallel with crystallographic planes of the Si based material member 10. In a representative embodiment the top surface 31 on the pedestal 12 is substantially parallel with a $\{100\}$ crystallographic plane of the Si based material member 10. For illustrative purposes the figures show the cross sections of two pedestals 12 that have differing dimensions.

In an alternate embodiment the pedestals 12 may not be defined by trenches formed in member 10, but may be grown, using, for instance, selective epitaxy onto the Si based material member 10. The pedestals 12 may be Si, or a Si based material such as SiGe, with up to approximately 60% of Ge concentration. FIG. 4 depicts the result of the various possible embodiments, with the pedestal 12 situated over a monocrystalline Si based material member 10.

Figure 5:
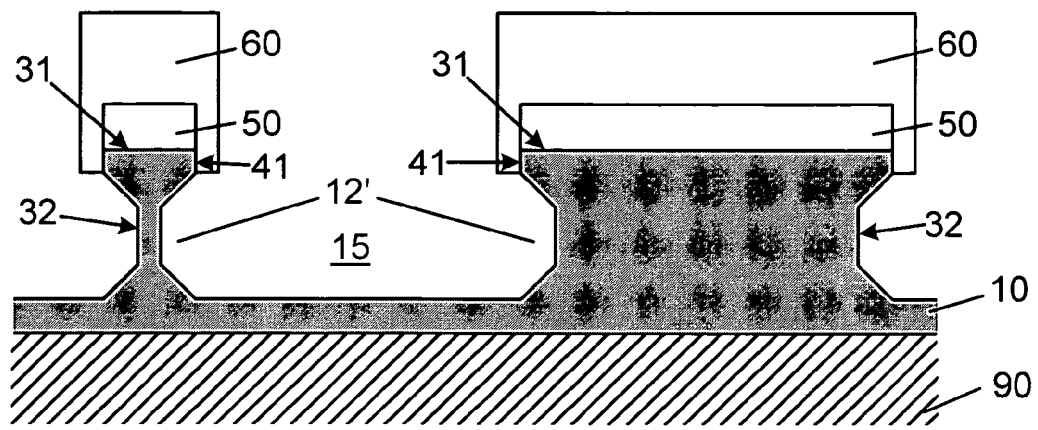
FIG. 5 shows a schematic cross sectional view in the fabrication of pedestals in a Si based material member where a wet anisotropic etch has been performed.
Figure 6:
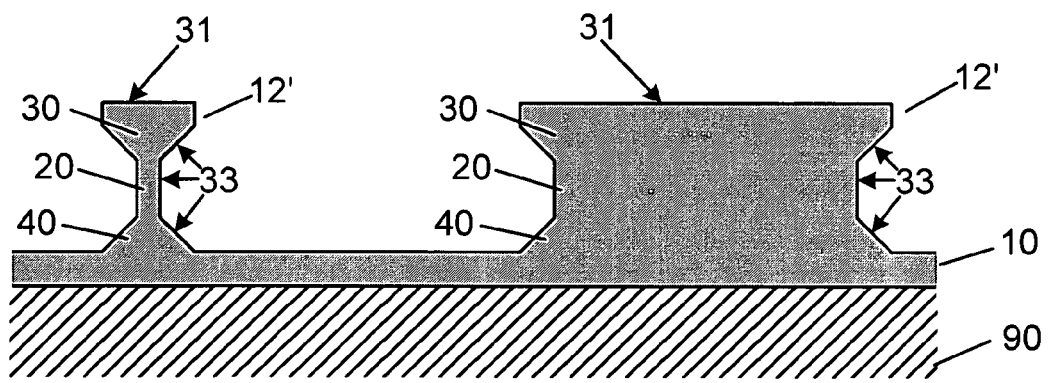
FIG. 6 shows a schematic cross sectional view of the faceted, undercut pedestals.

FIG. 5 shows a schematic cross sectional view in the fabrication of pedestals 12' in member 10, where a wet anisotropic etch has been performed, and FIG. 6 shows a schematic cross sectional view of the faceted, undercut pedestals 12'. The indicator number "12'" is used in the figures to indicate that the pedestal underwent the anisotropic wet etch process. The structure schematically shown on FIG. 4 is exposed to wet etching to result in the structure schematically shown on FIG. 5. The wet etch solution contains ammonium hydroxide ($NH_4OH$). The anisotropic Si based material etching characteristics of $NH_4OH$ has been studied already, as it is taught, for instance, in U.S. Pat. No. 6,566,273 entitled: "Etch selectivity inversion for etching along crystallographic directions in silicon" to S. Kudelka, incorporated herein by reference.

In a preferred embodiment the wet etch solution is a mixture water ($H_2O$) and ammonium hydroxide. Due to the anisotropic etch rates of Si based material crystallographic planes in this solution the sidewalls 32 become faceted 33.

The water and ammonium hydroxide ($NH_4OH$) in the solution are mixed in ratios of about between 15:1 and 200:1. A water to $NH_4OH$ ratio of approximately 160:1 is preferable for typical embodiments of the invention. The water used in the wet etch solution is preferably deionized water (DI). Furthermore, in exemplary embodiments the water of the wet etch solution is also degasified (dissolved gases, preferably oxygen, removed). This ammonium hydroxide/water solution is also an excellent cleaning agent of the exposed semiconductor surfaces.

During the anisotropic etch with the water and $NH_4OH$ the temperature of the wet etch solution in representative embodiments was selected to be between 25° C. and 70° C. In the water —$NH_4OH$ mixture the etch rate of $\{111\}$ Si based material crystallographic planes are typically about two orders of magnitude slower than those of the $\{100\}$ or $\{110\}$ planes.

The facets 33 and the top surface 31 are substantially parallel with crystallographic planes of the Si based material member 10. The facets 33 create a reduced cross section second segment 20 on the Si based material pedestal 12'. The second segment 20 is beneath a first segment 30. The protection by dielectric layers 50 and 60 on the top surface 31 of the first segment 30, shown in FIG. 5, resulted in such facet formation that the second segment 20 has a smaller cross section than the first segment 30. This results in a structure where the FET transistor hosted in, or above, the first segment 30, has no deep Si based material underneath because of the undercutting facets 33.

In the reduced cross section segment 20, the dopant concentration is selected to be such that this segment 20 is electrically conductive. In this manner an electrical continuity is allowed between the first segment 30, hosting the FET device, and the Si based material member 10.

The undercutting of the first segment 30 and the electrical connection to the Si based material member 10 has advantages for FET operations. The junction area of source and drain of the FET, formed later in the process, is reduced, therefore the junction capacitance is also reduced leading to higher device performance. Furthermore, the threshold voltage $V_t$ of the FET can still be controlled by applying a voltage to the body of the FET using the Si based material member 10, and conveyed to the FET by the reduced cross section second segment 20.

As the result of a dielectric layer 60 extended over the sidewalls, as first depicted in FIG. 3, the wet etching of the plurality of sidewalls 32 is prevented alongside a strip 41, which strip borders the top surface 31. The width of this strip 41 is determined by specific needs of the FET device that is being fabricated. In some embodiments this strip 41 may be omitted from the fabrication, in which case the facets 33 and top surface 31 would border, or intersect, each other.

The anisotropic wet etching of the unprotected member 10, as shown in FIG. 6, results in a third segment 40 on the pedestal 12' beneath the second segment 20, with the third segment 40 having a larger cross section than the second segment 20. Depending on the specific needs of the FET to be fabricated, this third segment 40 may be omitted, for instance by appropriately protecting member 10 before the anisotropic wet etch. Even for such embodiments when the third segment 40 may be omitted, and some of the sidewalls 32 for various reasons may be fully protected against the anisotropic wet etch, typically at least one of the plurality of sidewalls 32 has at least two facets 33.

Figure 7:
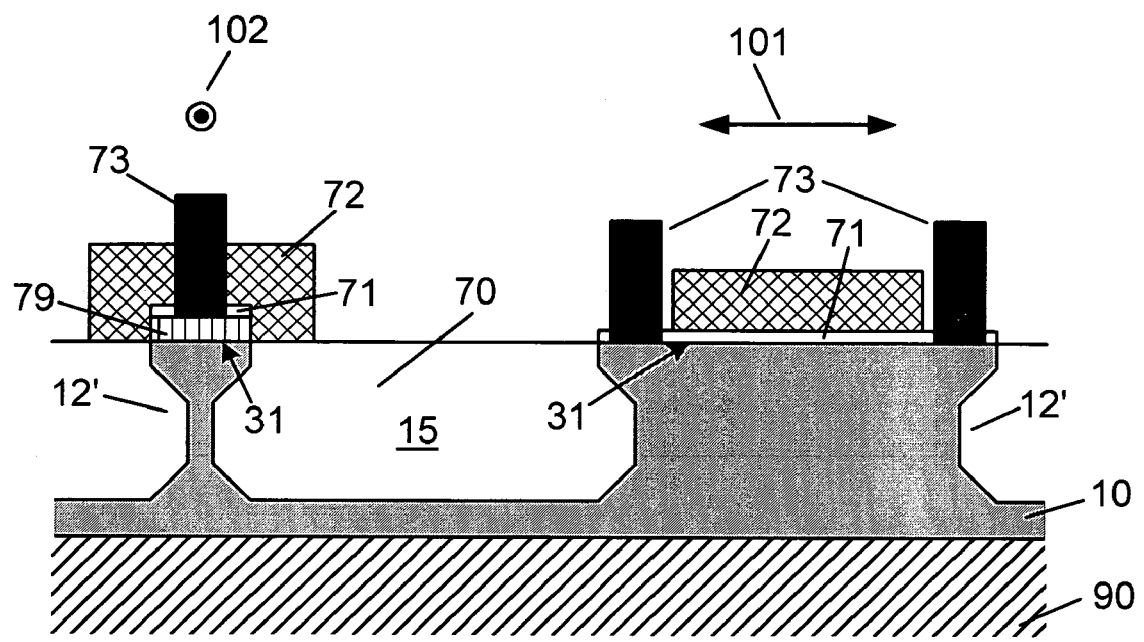
FIG. 7 shows a schematic cross sectional view of field effect devices hosted by the faceted, undercut pedestals.

FIG. 7 shows a schematic cross sectional view of field effect devices hosted by the faceted, undercut pedestals 12'. After having fabricated the faceted pedestals 12', the device fabrication is completed along lines know in the art, with the device having at least one FET associated with pedestal 12'. For illustrative purposes FIG. 7 shows the two cross sections depicted in the previous figures with the fabricated FET devices oriented orthogonally relative to one another. In one device the direction of the current flow 101 is in the plane of the cross section, and in the other device the direction of the current flow 102 is perpendicular to the plane of the cross section.

As shown in FIG. 7, trench 15 has been filled with a dielectric 70, typically an oxide. Gate dielectric 71, typically an oxide or oxynitride has been formed, and a gate conductor 72 applied. Contacts 73 to the source and drain can also be made by methods known in the art. It is possible that during completing the fabrication of the FET, portions of member 10 are converted to a material of good conductivity, such as a silicide.

In the FET device with the direction of the current flow 101 in the plane of the cross section the channel of the FET extends from the top surface 31 into pedestal 12'. The FET device with the direction of the current flow 102 perpendicular to the plane of the cross section is hosted in a semiconducting layer 79 bonded to the top surface 31. This is shown for illustrating that the usefulness of the low capacitance and body contact afforded by the ammonium hydroxide anisotropic etch encompasses a wide variety of FETs. In a typical embodiment the semiconducting layer 79 bonded to the top surface 31 could have been epitaxially grown at some stage of the process. The semiconducting layer 79 itself may be a Ge layer, SiGe layer, or a III-V semiconductor, or any other that provides some operational advantage to the overall device structure. Any pedestal 12' first segment 30 or any additional semiconducting layer 79 in some embodiments of the invention may host more than one FET device. Independently whether the FET channel extends from the top surface 31 directly into the pedestal 12', or the FET device is hosted in a semiconducting layer 79 bonded to the top surface 31, the FET device is coupled to the top surface 31.

Many modifications and variations of the present invention are possible in light of the above teachings, and could be apparent for those skilled in the art. The scope of the invention is defined by the appended claims.

We claim:

1. A method for fabricating a field effect device, comprising:

producing a pedestal by forming a trench in a monocrystalline Si layer of a SOI wafer, said pedestal having a top surface and a plurality of sidewalls, wherein said top surface and said plurality of sidewalls are so oriented as to be substantially parallel with crystallographic planes of said layer of said SOI wafer, wherein said top surface is oriented to be substantially parallel with a {100} crystallographic plane of said layer of said SOI wafer;

wet etching said pedestal with a mixture of water and ammonium hydroxide ($NH_4OH$), wherein selecting the ratio of water to ammonium hydroxide to be between about 15:1 and about 200:1, and the temperature of said mixture to be between about 25° C. and about 70° C., wherein due to differing etch rates of crystallographic planes in said solution said plurality of sidewalls become faceted, wherein said faceting creates a reduced cross section segment on said pedestal;

preventing said wet etching of said top surface by covering said top surface with a dielectric layer;

preventing said wet etching of said plurality of sidewalls alongside a strip by covering said strip with a dielectric layer, wherein said strip borders said top surface; and in said reduced cross section segment, selecting a dopant concentration such that said reduced cross section segment is electrically conductive, wherein allowing for electrical continuity between said field effect device and said layer of said SOI wafer, wherein said field effect device is electrically coupled to said top surface; and completing fabrication of said field effect device.

* * * * *